United States Patent [19]

Sawai et al.

[11] Patent Number: 4,850,884
[45] Date of Patent: Jul. 25, 1989

[54] CONTROLLER-INCLUDING WIRING APPARATUS FOR AUTOMOTIVE VEHICLE

[75] Inventors: Mamoru Sawai; Mitsugu Watanabe; Mitsuji Kubota, all of Shizuoka, Japan

[73] Assignee: Yazaki Corporation, Japan

[21] Appl. No.: 126,490

[22] Filed: Nov. 30, 1987

[30] Foreign Application Priority Data

Dec. 4, 1986 [JP] Japan ............................... 61-287637

[51] Int. Cl.$^4$ ............................................... H01R 9/09
[52] U.S. Cl. ....................................... 439/76; 361/399
[58] Field of Search .............................. 439/55, 74–78; 361/394–399, 412

[56] References Cited

U.S. PATENT DOCUMENTS

| 4,135,226 | 1/1979 | Kourimsky | 439/76 |
| 4,218,724 | 8/1980 | Kaufman | 361/399 |
| 4,355,853 | 10/1982 | Kourimsky | 439/76 |
| 4,555,638 | 11/1985 | Lobe | 307/10 R |
| 4,685,753 | 8/1987 | Isshiki et al. | 439/78 |
| 4,689,718 | 8/1987 | Maue et al. | 361/395 |
| 4,703,397 | 10/1987 | Minoura et al. | 361/420 |

FOREIGN PATENT DOCUMENTS 1924916 12/1970 Fed. Rep. of Germany.
3424857 10/1986 Fed. Rep. of Germany.

*Primary Examiner*—Neil Abrams
*Attorney, Agent, or Firm*—Wigman & Cohen

[57] ABSTRACT

To decrease the number of connectors and increase the connection reliability in a controller-including wiring apparatus for an automotive vehicle, the apparatus comprises (a) a junction block having at least one bus bar circuit board on which harness branch circuits are arranged and to which electric devices are connectable; (b) a controller unit having at least one printed circuit board on which control circuits are arranged to control the electric devices; and (c) a plurality of junction terminals collectively arranged at an end of the junction block and having first and second ends and middle portions, some of the middle portions being joined to the branch circuits, the first ends being for coupling to said controller unit and the second ends being for coupling to the wire harness.

5 Claims, 3 Drawing Sheets

CONTROLLER-INCLUDING WIRING APPARATUS FOR AUTOMOTIVE VEHICLE

BACKGROUND OF THE INVENTION

1. Field of the Invention

The present invention relates generally to a controller-including wiring apparatus for an automotive vehicle and more specifically to a junction structure of the controller-including wiring apparatus.

2. Description of the Prior Art

Conventionally, a junction block has been used for wiring an automotive vehicle. The junction block includes bus bar circuit boards connected to a wire harness as branch circuits, and some electric parts (e.g. fuse, relay, etc.) arranged on the board.

However, recently, there exists a tendency that the number of electric devices mounted on a vehicle increases more and more to improve safety and riding confortability of the vehicle, so that the number of control circuits also increase year by year. In addition, since the kinds and the number of the electric and electronic devices required for an automotive vehicle are different according to vehicle models or vehicle grades, it is necessary to prepare a great number of junction blocks having different circuit configurations.

To overcome the above-mentioned problems, the junction block is usually separated into two, wiring (harness branch connecting circuits, a power supply circuit, etc.) and controller, circuits, and these two circuits are removably coupled with each other. Therefore, only the controller circuit can be replaced with another controller circuit according to the number and the kinds of the electric devices.

FIG. 1 shows an example of prior-art controller-including wiring apparatus.

In the drawing, the controller unit CONT includes a casing 101, a printed circuit board 102, two input and output connectors 103A and 103B, and a junction block connector 104. On the printed circuit board 102, an electromagnetic relay 105, electronic parts 106 such as resistors, capacitors, LSI, etc. are arranged. This controller unit CONT is connected to a junction block JB via the junction block connector 104, and to an external wire harness via the two input and output connectors 103A and 103B. Terminals of these connectors 103A, 103B and 104 are all connected directly to the printed circuit board 102.

In the conventional controller unit CONT, however, since the terminals of the connectors 103A and 103B to be connected to an external wire harness project directly from the printed circuit board 102, when connected to the external wire harness, a stress is readily applied to the printed circuit board 102. Therefore, there exists a problem in that copper foil formed on the printed circuit board 102 is easily peeled off and therefore the reliability of the controller unit CONT is poor. In addition, in usual, several connectors (not shown) to be coupled to the junction block and the wire harness are arranged separately on the casing 101 of the controller unit CONT, it takes much time to connect the controller unit CONT to the wire harness and the junction block JB, in wire harness production processes or vehicle assembly processes, with increasing number of the connectors to be coupled to the controller unit CONT, thus resulting in an increase in the manufacturing cost.

SUMMARY OF THE INVENTION

With these problems in mind, therefore, it is the primary object of the present invention to provide a controller-including wiring apparatus for an automotive vehicle, which can reduce the number of connectors to be coupled to the wiring apparatus, enhance harness connection or vehicle assembly productivity, and improve connection reliability without applying stress to the printed circuit board within the controller unit when various connectors are coupled thereto.

To achieve the above-mentioned object, a controller-including wiring apparatus for an automotive vehicle, for controllably connecting a wire harness to a plurality of electric devices mounted on the automotive vehicle, according to the present invention, comprises: (a) a junction block having at least one bus bar circuit board on which harness branch circuits are arranged and to which the electric devices are connectable; (b) a controller unit having at least one printed circuit board on which control circuits are arranged to control the electric devices; and (c) a plurality of junction terminals, collectively arranged at an end of said junction block and selectively coupled to the harness branch circuit near a middle portion thereof, for selectively coupling said wire harness and controller unit to said junction block at both ends thereof.

The junction terminals are tab-like terminal strips extending in a direction perpendicular to the bus bar circuit board. The wire harness and the controller unit are coupled to the junction block via the junction terminals with the junction block sandwiched between the wire harness and the controller unit.

The junction terminals are grouped into three kinds. The first terminal member is formed with a first engagement portion connectable to the controller unit, a second engagement portion connectable the junction block, and a third engagement portion connectable to the wire harness. The second terminal member is formed with a first engagement portion connectable to the controller unit and a second engagement portion connectable to the wire harness. The third terminal member is formed with a first engagement portion connectable to the controller unit and a second engagement portion connectable to the junction block.

In the controller-including wiring apparatus of the present invention, since the controller unit and the harness are indirectly connected to the junction block via the relatively short junction terminals, it is possible to reduce stress applied to the printed circuit board of the controller unit when the wire harness is coupled to or decoupled from the junction block, thus improving the connection reliability of the wiring apparatus.

Further, since the controller unit can be coupled to the junction block and the wire harness simultaneously via the junction terminals, it is possible to reduce the number of connectors to be coupled to the wiring apparatus and thus streamline the connector coupling work in wire harness production process or vehicle production process.

BRIEF DESCRIPTION OF THE DRAWINGS

The features and advantages of the controller-including wiring apparatus for an automotive vehicle according to the present invention will be more clearly appreciated from the following description of the preferred embodiment of the invention taken in conjunction with the accompanying drawings in which like reference numerals designate the same or similar elements or sections throughout the figures thereof and in which.

DETAILED DESCRIPTION OF THE PREFERRED EMBODIMENTS

With reference to the attached drawings, an embodiment of the controller-including wiring apparatus for an automotive vehicle according to the present invention will be described.

Figure 2:
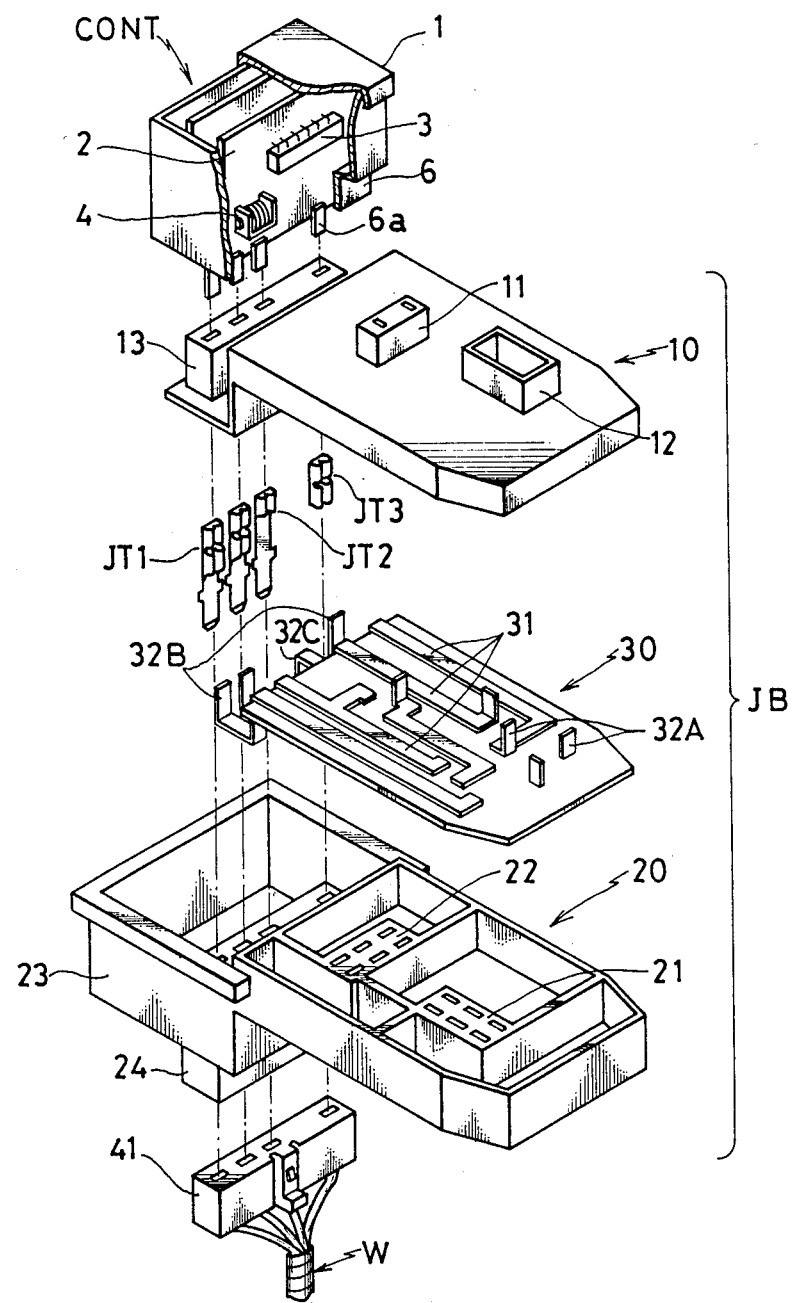
FIG. 2 is an exploded view showing an embodiment of the controller-including wiring apparatus according to the present invention.

FIG. 2, the controller-including wiring apparatus can controllably connect a wire harness W to electric devices mounted on an automotive vehicle, which roughly comprises a controller unit CONT, a junction block JB, and a plurality of junction terminals $JT_1$, $JT_2$, $JT_3$.

The controller unit CONT is composed of a casing 1, several printed circuit boards 2 each having electronic parts 3, a relay 4, etc., and a controller connector 6 coupled to the junction block JB. Within this controller connector 6, a plurality of controller terminals 6a led from input/output circuits formed on the printed circuit board 2 are arranged so as to be mated to the junction terminals JT. The controller unit CONT can be freely modified according to vehicle models or vehicle grades.

The junction block JB includes a main cover 10, an under cover 20, and a bus bar board 30 housed between the main cover 10 and the under cover 20.

The main cover 10 is formed with main cover connector housings 11 and 12 to which a fuse, a relay, another harness, etc. can be coupled from above and further bus bars 31 and 32 (described later) are inserted from under to these main cover connector housings 11 and 12. Further, a junction terminal housing 13 to which the controller terminals 6a are inserted is provided at an end of the main cover 10 of the junction block JB.

The bus bar board 30 is provided with a predetermined circuit pattern of branch circuits from a wire harness W connected thereto via the junction terminals JT and a harness connector 41. The circuit pattern is formed by arranging a plurality of bus bars 31 each having a vertically extending tab terminal 32A at an end or an intermediate portion of the bus bars 31, as depicted in FIG. 2. In the embodiment shown in FIG. 2, in particular, it should be noted that some bus bars 31 are formed with a vertically (upward or downward) extending tab terminal 32B and 32C, respectively at an end of the bus bar board 30. The upward extending tab terminals 32B are connected to the controller unit CONT via the junction terminal JT and the downward extending tab terminals 32C are directly connected to the wire harness W without connection with the junction terminal JT.

In FIG. 2, only a single bus bar board 30 is shown for simplification. However, in practice, a plurality of bus bar boards 30 are stacked and housed between the main cover 10 and the under cover 20.

The under cover 20 is also formed with under cover connector housings 21 and 22 to which the tab terminals 32A (extending downward in FIG. 2) are fitted from above. To these under cover connector housings 21 and 22, terminals of other parts or wire harnesses are inserted. Further, the under cover 20 is formed with a controller unit housing 23 and a harness connector housing 24.

Figure 3:
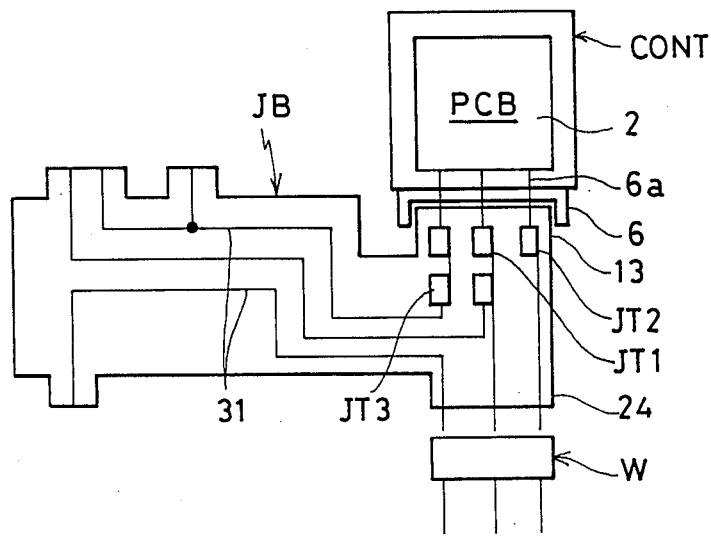
FIG. 3 is a wiring diagram for assistance in explaining internal connections of the controller-including wiring apparatus shown in FIG. 2.

FIG. 3 shows a wiring diagram between the controller unit CONT, the junction block JB and the wire harness W via three junction terminals $JT_1$, $JT_2$ and $JT_3$, diagrammatically. FIG. 3 depicts that the controller unit CONT can be selectively coupled to the junction block JB via the junction terminal JT. Further, when the wire harness W is coupled to the junction block JB, the wire harness can also be selectively coupled to the branch bus bar 31 and the controller unit CONT.

Figure 4A:
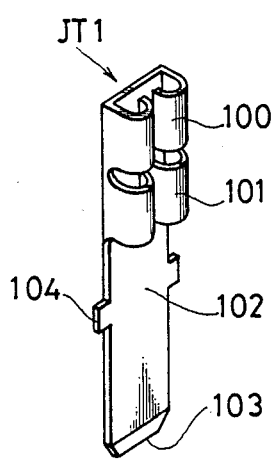
FIG. 4A is an enlarged perspective view showing a first junction terminal incorporated in the junction block shown in FIG. 2.
Figure 4B:
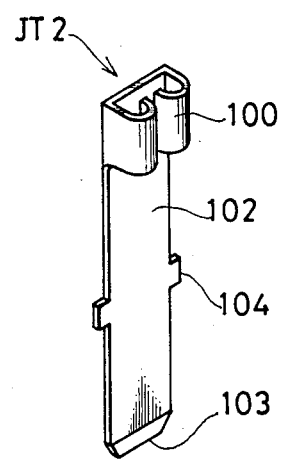
FIG. 4B is an enlarged perspective view showing a second junction terminal incorporated therein.
Figure 4C:
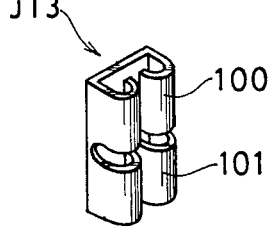
FIG. 4C is an enlarged perspective view showing a third junction terminal incorporated therein.

The junction terminals JT can be grouped into three types as depicted in FIGS. 4A, 4B and 4C. A first junction terminal $JT_1$ can connect the controller terminal 6a from the printed circuit board 2 of the controller unit CONT, the tab terminal 32B from the bus bar 31 of the junction block JB, and the harness connector housing 41 of the wire harness W to each other. For providing the above-mentioned connections, the first junction terminal $JT_1$ is formed with a first female terminal (engagement) portion 100 mated with the controller terminal 6a, a second female terminal (engagement) portion 101 mated with the bus bar tab terminal 32B, and a male terminal (engagement) portion 103 inserted into the harness connector housing 41, in addition to a stopper portion 104 for positioning the junction terminal $JT_1$ in the harness connector housing 24.

A second junction terminal $JT_2$ can connect the controller terminal 6a from the printed circuit board 2 of the controller unit CONT and the harness connector housing 41 of the wire harness W to each other. That is, the second junction terminal $JT_2$ is formed with a first female terminal portion 100 mated with the controller terminal 6a and a male terminal portion 103 inserted into the harness connector housing 41, in addition to a stopper 104 for positioning the junction terminal $JT_2$ in the harness connector housing 24.

A third junction terminal $JT_3$ can connect the controller terminal 6a from the printed circuit board 2 of the controller unit CONT and the tab terminal 32B from the bus bar 31 of the junction block JB to each other. This third junction terminal $JT_3$ is formed with a first female terminal portion 100 mated with the controller terminal 6a and a second female terminal portion 101 mated with the bus bar tab terminal 32B.

In assembly, a plurality of bus bar boards 30 (only a single board is shown in FIG. 2) are stacked on the under cover 20 of the junction block JB; some junction terminals $JT_1$, $JT_2$ and $JT_3$ are selectively mated with the vertically (upward) extendiang tab terminals 32B; the main cover 10 is put on the bus bar boards 30 to assemble a junction block JB; the controller unit CONT is coupled to the junction block JB by inserting the controller terminals 6a into the junction terminal housing 13 of the main cover 10. The controller-including wiring apparatus thus assembled is coupled with the wire harness in harness production process.

Figure 1:
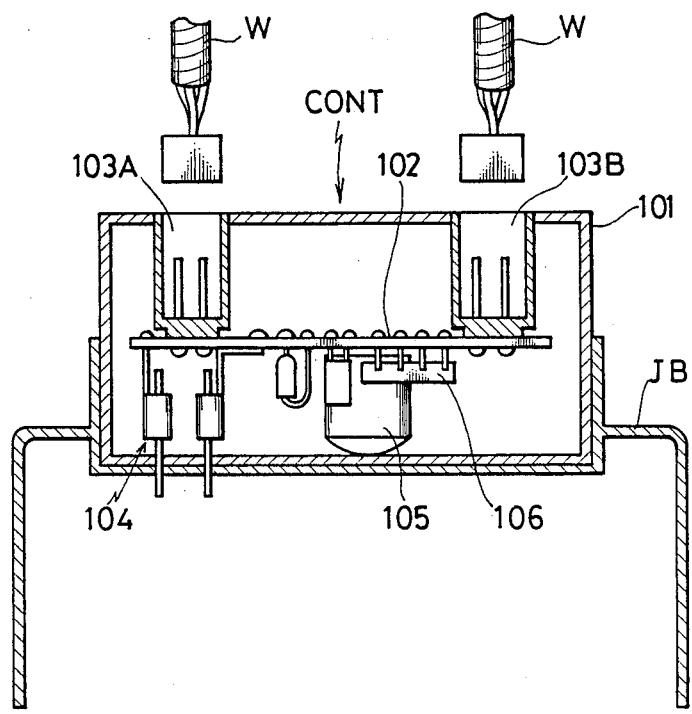
FIG. 1 is a diagrammatical cross-sectional view showing a prior-art controller unit coupled to an external wire harness and a junction block.

The structural features of the controller-including wiring apparatus of the present inventions are as follows:

(1) In the prior-art junction block including a controller unit as shown in FIG. 1, the harnesses W and the junction block JB are directly connected to the controller unit CONT, so that there exists a problem in that the printed copper foil of the printed circuit board 102 is readily peeled off when the harnesses are repeatedly coupled to the controller unit CONT.

In the junction block of the present invention, since the controller unit CONT, and the harness W are indirectly coupled to each other via the junction terminals JT also connected to the junction block JB, the three sections (controller unit, harness and junction block) are all indirectly coupled to each other via the junction terminals. Further, since the harness W and the controller unit CONT are coupled to each other via relatively short junction terminals JT arranged collectively at an end of the junction block, it is possible to reduce stress applied to the printed circuit board 2 of the controller unit CONT when the harness W is connected to or disconnected from the junction block JB, thus improving the connection reliability of the wiring apparatus.

(2) Since the controller unit CONT is provided with only a single controller connector 6 (no harness connecting connectors are provided as in FIG. 1) and further coupled to the harness W and the junction block JB simultaneously via the same junction terminals JT, it is possible to reduce the number of connectors to be coupled to the wiring apparatus and thus the wiring work of the wire harness and the controller unit to the junction block, in wire harness production process or car production process.

What is claimed is:

1. A controller-including wiring apparatus for an automotive vehicle, for controllably connecting a wire harness to a plurality of electric devices mounted on the automotive vehicle, the wire harness being connected at one end of said wiring apparatus, which comprises:
    (a) a junction block including a housing with outwardly facing walls and containing at least one bus bar circuit board on which harness branch circuits are arranged and to which the electric devices are connectable; wherein
        (1) said at least one bus bar board contains at least one bus bar forming said harness branch circuits, at least one tab terminal extending upwardly from a bus bar board surface of said bus bar circuit board connected to said at least one bus bar, and at least one end tab terminal extending upwardly or downwardly from a bus bar circuit board end connected to said at least one bus bar;
        (2) a main cover wall provided with connector housings to which extended elements can be connected; and
        (3) an under cover wall formed with connector housings to which the at least one tab terminal can be fitted;
    (b) a controller unit having at least one printed circuit board on which control circuits are arranged to control the electric devices, said controller unit being connectable to said wiring apparatus at the end of said wiring apparatus opposite the end to which said wire harness is connected; and
    (c) a plurality of junction terminals, collectively arranged at an end of said junction block and having first and second ends and middle portions, some of the middle portions being joined to the branch circuits, the first ends being for coupling to said controller unit at said opposite end of said wiring apparatus and the second ends being for coupling to the wire harness at said one end of said wiring apparatus and with the outwardly facing walls of the junction block housing sandwiched between the wire harness and the controller unit.

2. The controller-including wiring apparatus for an automotive vehicle as set forth in claim 1, wherein some of said junction terminals comprises a first terminal member formed with a first engagement portion connectable at the first end to said controller unit, a second engagement portion connectable at the middle portion to one of said branch circuits, and a third engagement portion connectable at the second end to the wire harness.

3. The controller-including wiring apparatus for an automotive vehicle as set forth in claim 1, wherein some of said junction terminals further comprises a second terminal member formed with a first engagement portion connectable at the first end to said controller unit and a second engagement portion connectable at the second end to the wire harness, the middle portion thereof being connected to no branch circuits.

4. The controller-including wiring apparatus for an automotive vehicle as set forth in claim 1, wherein said some of said junction terminals further comprises a third terminal member formed with a first engagement portion connectable at the first end to said controller unit and a second engagement portion connectable at the middle portion to one of said branch circuits, the second end thereof being connected no wire harness.

5. The controller-including wiring apparatus for an automotive vehicle as set forth in claim 1, wherein said junction terminals are tab-like terminal strips extending in a direction perpendicular to the bus bar circuit board, the wire harness and said controller unit being coupled to said junction block via said junction terminals with the outwardly facing walls of said junction block housing sandwiched between the wire harness and said controller unit.

* * * * *